(12) United States Patent
Tran et al.

(10) Patent No.: US 7,973,563 B2
(45) Date of Patent: Jul. 5, 2011

(54) PROGRAMMABLE IO ARCHITECTURE

(75) Inventors: Huan Huu Tran, Santa Clara, CA (US); Gregory Jon Richmond, Cupertino, CA (US)

(73) Assignee: Silicon Labs Spectra, Inc., Sunnyvale, CA (US)

( * ) Notice: Subject to any disclaimer, the term of this patent is extended or adjusted under 35 U.S.C. 154(b) by 0 days.

(21) Appl. No.: 12/370,163

(22) Filed: Feb. 12, 2009

(65) Prior Publication Data

US 2009/0206875 A1   Aug. 20, 2009

Related U.S. Application Data

(60) Provisional application No. 61/028,996, filed on Feb. 15, 2008.

(51) Int. Cl.
*H03K 19/094* (2006.01)
(52) U.S. Cl. ............ 326/86; 326/87; 327/109; 327/112; 327/170
(58) Field of Classification Search .............. 326/82–83, 326/86–87; 327/108–109, 112, 170
See application file for complete search history.

(56) References Cited

U.S. PATENT DOCUMENTS

| | | | | |
|---|---|---|---|---|
| 5,300,835 A * | 4/1994 | Assar et al. | ...................... | 326/68 |
| 5,489,858 A * | 2/1996 | Pierce et al. | ................... | 326/56 |
| 5,828,827 A * | 10/1998 | Mateja et al. | ................... | 714/30 |
| 6,133,751 A * | 10/2000 | Churcher et al. | ................ | 326/49 |
| 6,184,708 B1 * | 2/2001 | Jenkins, IV | ...................... | 326/39 |
| 6,266,793 B1 * | 7/2001 | Mozdzen et al. | ............. | 714/727 |
| 6,314,539 B1 * | 11/2001 | Jacobson et al. | ............... | 714/727 |
| 6,480,026 B2 * | 11/2002 | Andrews et al. | ................ | 326/39 |
| 6,586,921 B1 * | 7/2003 | Sunter | ......................... | 324/76.11 |
| 6,825,698 B2 * | 11/2004 | Wang et al. | .................... | 327/108 |
| 7,215,146 B2 * | 5/2007 | Khan | ............................... | 326/83 |
| 7,411,421 B1 * | 8/2008 | Steinke et al. | .................. | 326/83 |
| 2004/0044937 A1 * | 3/2004 | Dubey | ........................... | 714/727 |
| 2006/0170455 A1 * | 8/2006 | Torres et al. | .................... | 326/83 |
| 2008/0079494 A1 * | 4/2008 | Aram | ............................ | 330/277 |
| 2008/0204076 A1 * | 8/2008 | Shaizaf et al. | ................... | 326/62 |

OTHER PUBLICATIONS

Declaration of Greg Richmond, Vice President of Engineering and Chief Technical Officer of SpectraLinear, Inc., under 37 CFR 1.56, Feb. 18, 2010.

* cited by examiner

*Primary Examiner* — Jason M Crawford
(74) *Attorney, Agent, or Firm* — Zagorin O'Brien Graham LLP (57) ABSTRACT

A buffer device coupled to at least one input/output port of an integrated circuit has a plurality of control inputs configured to receive configuration programming information. The at least one input/output circuit is capable of: (a) being configured in a directional sense of communication by the configuration programming information, (b) being configured as an input circuit which can be further configured to provide input logic switching level thresholds according to the configuration programming information, and (c) being configured as at least one output circuit which can be further configured to provide an output drive strength according to the configuration programming information.

27 Claims, 7 Drawing Sheets

PROGRAMMABLE IO ARCHITECTURE

CROSS-REFERENCES TO RELATED APPLICATIONS

This application claims priority from co-pending U.S. Provisional Patent Application No. 61/028,996, filed Feb. 15, 2008, entitled "PROGRAMMABLE IO ARCHITECTURE", which is hereby incorporated by reference, as if set forth in full in this document, for all purposes.

BACKGROUND

The present invention relates to integrated circuits in general and, in particular, to programmable input/output functionality for clock circuitry.

One of the critical success factors in the design and development of integrated circuits is the ability to adapt to new functional requirements in next generation electronic products quickly. Traditional ways to reduce the time it takes to introduce new products is to increase the available development resources and subdivide tasks to perform them in parallel. Additionally, circuits can be designed in anticipation of future requirements so that they can be reconfigured quickly. Known reconfigurable architectures include masked ROM, gate-arrays and analog arrays where logic, memory content or analog building block interconnect and attributes can be changed by modifying a subset of the normal process layers, typically the metal interconnect layers.

The introduction of non-volatile programming technology such as Electrically Programmable Read-Only Memory (EPROM), Electrically Erasable Programmable Read-Only Memory (EEPROM), and One-Time-Programmable antifuse (OTP), allowed this reconfiguration to be done through electrical programming rather than wafer fabrication reticle changes. Such electrical programmability requires the use of passive and/or active switches to reconfigure the signal path. While the non-volatile memory technology has provided some flexibility in implementing reconfigurable ICs, a cost effective technique which enables a high level of configurability without consuming significant amounts of power and silicon real estate has not yet been disclosed.

BRIEF SUMMARY

In accordance with embodiments of the invention, a programmable I/O architecture is disclosed which achieves a high degree of programmability with minimal impact on the performance characteristics (such as power consumption) and the die size.

Among other features and advantages, embodiments of the programmable I/O architecture can provide the following features for any input or output buffer: programmable I/O types (input, output, bi-directional); programmable output drive-strengths; programmable output types (push-pull, NMOS open-drain, PMOS open-drain); programmable output skew (useful for minimizing skews between outputs); programmable input/output polarity (useful for implementing differential buffers and different active polarity of input signals); programmable outputs (can take different output signals from core); programmable input types (CMOS, TTL, three-level inputs, low-threshold inputs); and programmable internal input pull-up/pull-down resistors (provide wide range of resistor values).

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components (e.g., a lower-case character). If only the first reference label is used in the specification, the description is applicable to any one of the similar components having the same first reference label irrespective of the second reference label.

DETAILED DESCRIPTION

In clock circuits, it is often desirable to provide the ability to change which pins are inputs, which are outputs, and to change the signal conditioning path. For example, to make a product which addresses a larger market share, and is therefore more valuable, it is often desired to change input switching thresholds, output duty cycle, output impedance, output skew, or output edge rate. Of course this programming variation must be done at minimal cost and at maximum performance. Therefore the programmable I/O architecture must be designed accordingly.

It may be desirable to have an I/O architecture that provides programmability of a particular instance of an I/O cell so that it can function as an input, output, or bi-directional cell. Additionally, drive characteristics capable of similar programmability would be further desirable. For instance, output drive cells that can be programmed for output drive strength, open-drain (NMOS or PMOS types), cell-to-cell skew, slew rate control, polarity reversal (active low/high for assertion), input source signal selection, input logic inversion level (i.e., switching level derived from TTL, CMOS, three-level, or low threshold input levels), and wider range of internal programmable input pull-up/pull-down resistance values would be desirable.

According to embodiments of the present invention, apparatus and techniques directed to a programmable input/output (I/O) buffer are provided. More particularly, the invention exemplifies programmable I/O buffer circuits that are configurable to be an input, an output, or bi-directional with configurable drive strength, slew rate, skew (cell-to-cell), and logic thresholds. By way of example, the invention provides embodiments generally directed to a programmable I/O buffer and control system that may configure a plurality of the I/O buffer cells at a system start time. The programmable I/O buffers are configured such that input and output drive characteristics, as well as related signal coupling with core circuitry are configured at system startup. Any system incorporating circuitry according to the present invention is readily configured to adapt to changes in system requirements and be reconfigured quickly.

Embodiments of the programmable I/O architecture provide the following features, which may be desirable for any input or output buffer: programmable I/O types (input, output, bi-directional); programmable output drive-strengths; programmable output types (push-pull, NMOS open-drain, PMOS open-drain); programmable output skew (useful for minimizing skews between outputs); programmable input/output polarity (useful for implementing differential buffers and different active polarity of input signals); programmable outputs (can take different output signals from core); programmable input types (CMOS, TTL, three-level inputs, low-threshold inputs); and programmable internal input pull-up/pull-down resistors (provide wide range of resistor values).

Figure 1A:
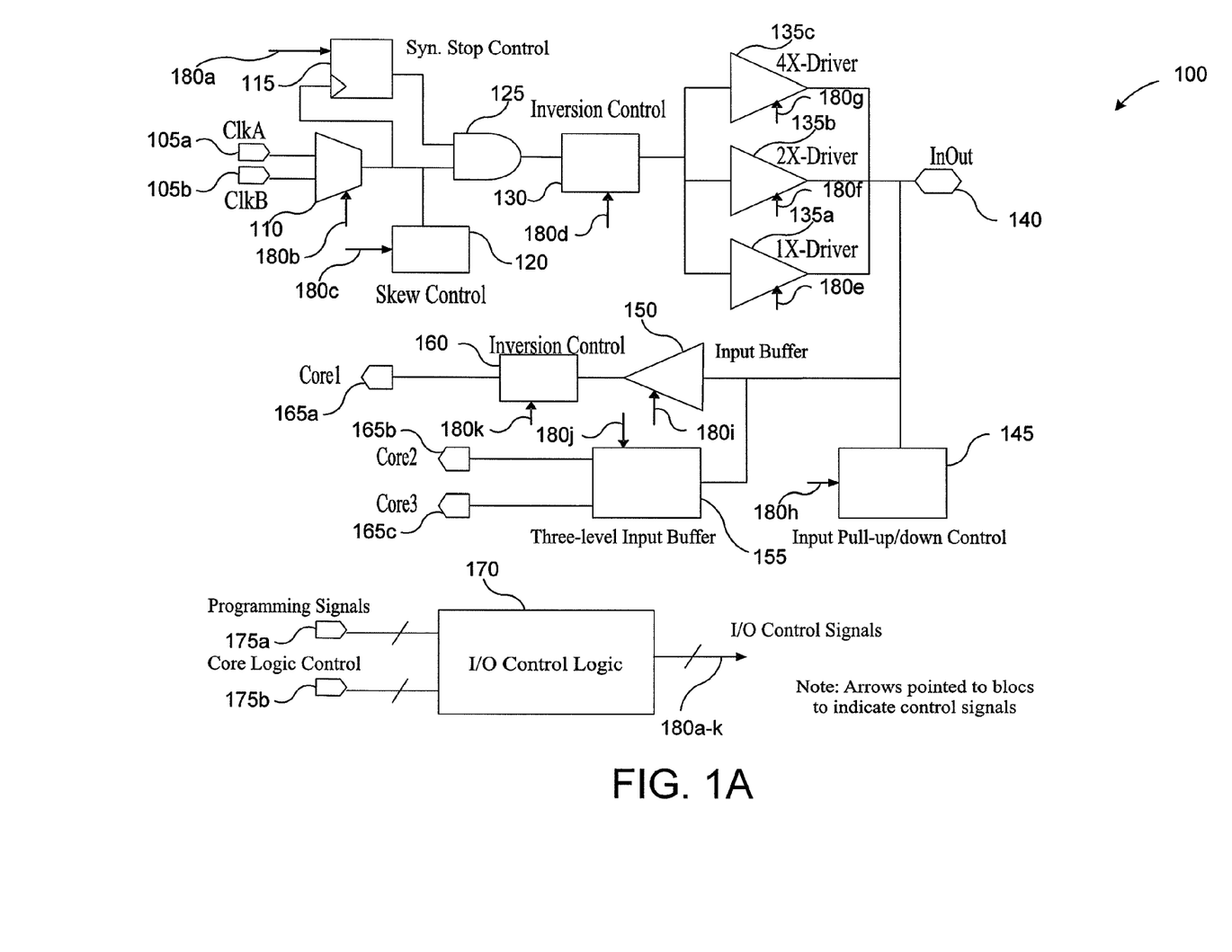
FIG. 1A shows a functional block diagram showing a programmable I/O buffer according to an embodiment of the present invention.

FIG. 1A is a block diagram showing a programmable I/O buffer 100 in accordance with an embodiment of the invention. The programmable I/O buffer 100 includes an InOut terminal 140 that is programmable to be either an input terminal or an output terminal, with certain respective input or output characteristics, as desired. Components of the programmable I/O buffer 100 are programmable via a number of I/O Control Signal lines 180*a-k*. As illustrated, a number of Programming Signals 175*a* (e.g., outputs from FIG. 5, element 550, below) and a number of Core Logic Control signals 175*b* (e.g., generated by logic, for example, Boolean logic, from the core) couple to inputs of an I/O Control Logic block 170. Embodiments of the I/O Control Logic block 170 generate the I/O Control Signal lines 180*a-k* by implementing various logical operations on the Programming Signals 175*a* and the Core Logic Control signals 175*b*. For example, a number of outputs of the I/O Control Logic block 170 couple to the I/O Control Signal lines 180*a-k*.

At system startup, in some embodiments, the Programming Signals 175*a* and the Core Logic Control signals 175*b* are provided to the I/O Control Logic block 170 in a particular sequence. Embodiments of systems and methods for providing the sequenced signals are discussed in U.S. patent application Ser. No. 12/369,868, filed Feb. 12, 2009, entitled "DOWNLOAD SEQUENCING TECHNIQUES FOR CIRCUIT CONFIGURATION DATA", which is hereby incorporated by reference in its entirety for all purposes.

The I/O Control Logic block 170 determines which of the I/O Control Signal lines 180*a-k* are supplied with signal levels suitable for configuring the corresponding logic block. Appropriate signal levels are produced such that each logic block coupled to the I/O Control Signal lines 180*a-k* receives a signal level appropriate to implement a desired configuration. The I/O Control Signal lines 180*a-k* are then used in various embodiments to provide the programmable input or output characteristics desirable from the InOut terminal 140. An artisan will readily appreciate that by general assessment and understanding of the particular programmable logic blocks in electrical communication with an I/O Control Logic block per the present invention, programming signals and core logic control signals may be provided which produce I/O control signal levels that configure the programmable logic blocks to provide electrical characteristics and communication directionality as described herein.

To use the InOut terminal 140 as an output terminal, various programmable components of the programmable I/O buffer 100 generate an output clock signal with desired characteristics. A first clock input CLKA 105*a* and a second clock input CLKB 105*b* couple to inputs of a multiplexer (mux) 110. In one embodiments, the mux 110 is part of a distributed mux block (e.g., FIG. 5, element 530). The mux 110 is controlled by a mux control signal 180*b* (e.g., one of the I/O Control Signal lines 180). While two clocks are shown, it will be appreciated that larger numbers of clocks are possible, and that the mux 110 and/or mux control signal 180*b* may be adapted accordingly to select among the larger number of clocks.

The selected clock output (e.g., an output of the mux 110) is then manipulated by one or more programmable components. For example, as shown, the output of the mux 110 couples with a clock input of a Synchronized Stop Control block 115 and a terminal of a Skew Control block 120. The Synchronized Stop Control block 115 is programmable to stop the clock output, using a Sync Stop Control block control input 180*a* (e.g., one of the I/O Control Signal lines 180). In one embodiment, the Synchronized Stop Control block 115 includes a flip-flop or other component, configured to synchronize performance to prevent stoppage of the clock during a clock cycle. The Skew Control block 120 is programmable to control the skew of the mux 110 output, using a Skew Control block control input 180*c* (e.g., one of the I/O Control Signal lines 180). In one embodiment, the Skew Control block 120 includes a number of programmable loads (e.g., a capacitor network) for providing gate loading to create delay in the mux 110 output.

In one embodiment, the mux 100 output (e.g., skewed by the Skew Control block 120) couples to a first input of a NAND gate 125 and an output of the Synchronized Stop Control block 115 couples to a second input of the NAND gate 125. In this way, the Synchronized Stop Control block 115 may be used to globally and controllably stop the clock output from the clock inputs 105. An output of the NAND gate 125 couples to an Inversion Control block 130. The Inversion Control block 130 is programmable to invert the output of the NAND gate, using an Inversion Control block control input 180*d* (e.g., one of the I/O Control Signal lines 180).

In some embodiments, an output of the Inversion Control block 130 couples to inputs of a 1X-Driver buffer 135*a*, a 2X-Driver buffer 135*b*, and a 4X-Driver buffer 135*c*. The Driver buffers 135 act to control the drive strength of the output signal, seen at the InOut terminal 140. In one embodiment, each Driver buffer 135 is programmable by a Driver buffer control input 180*e-g* (e.g., I/O Control Signal lines 180). The Driver buffer control inputs 180*e-g* may be used to control the drive strength in eight levels, using the eight possible 3-bit configurations (e.g., 000, 001, 010, 011, 100, 101, 110, and 111). For example, if a 3X drive strength is desired at the InOut terminal 140, I/O control signal levels on the 1X-Driver buffer control input 180*e* and the 2X-Driver buffer control input 180*f* are set, by the I/O Control Logic block 170, to a level that asserts enablement of these buffers (i.e., for example, a logic level 1 or high signal level) and the 4X-Driver buffer control input 180*g* receives a disabling signal level (i.e., for example a logic level 0 or low signal level).

To use the InOut terminal 140 as an input terminal, an input signal coupled with the InOut terminal 140 is routed to input control components, like an Input Pull-up/down Control block 145, an Input Buffer 150, and a Three-level input Buffer 155. For example, the output side of the Driver buffers 135 may be configured to cause the input signal to be routed to the input components (e.g., by causing the InOut terminal 140 to see infinite impedance at the outputs of the Driver buffers 135). Embodiments of the Input Pull-up/down Control block 145 bias the InOut terminal 140, forcing the InOut terminal 140 HIGH or LOW when left floating, without the need for an external biasing component. In certain embodiments, a "clamp" is provided as secondary ESD protection for the InOut terminal 140 being used as an input.

In some embodiments, the Input Pull-up/down Control block 145 includes one or more switchable resistors, programmable via the Input Pull-up/down Control block control input 180h (e.g., one of the I/O Control Signal lines 180). For example, in one embodiment, four blocks of resistors are coupled to a common pin. The four blocks are a weak pullup block, a weak pulldown block, a strong pullup block, and a strong pulldown block. Transistor channel geometries are selected, for example, to determine drive strength of the weak versus the strong blocks. Beta rationing between transistor devices may be used to tune particular resistance values in addition to certain programming features. These and other techniques may allow the buffer to support a wide range of internal pullup/pulldown resistors with a wide range of power supply voltage (e.g., 1.8V to 3.3V).

In certain embodiments, it is desirable to use the InOut terminal 140 to generate a two-level input signal (e.g., '1' or '0'); while in other embodiments, it is desirable to use the InOut terminal 140 to generate a three-level input signal. As illustrated, the input signal applied to the InOut terminal 140 is coupled with the Input Buffer 150, to generate a two-level input signal), which is programmable via Input Buffer control input 180i (e.g., one of the I/O Control Signal lines 180). An output of the Input Buffer 150 couples to an Inversion Control block 160. The Inversion Control block 160 is configured to provide the two-level input signal to a first core circuitry terminal (Core1) 165a as either an "active high" or "active low" signal, programmable via Inversion Control block control input 180k (e.g., one of the I/O Control Signal lines 180). The input signal applied to the InOut terminal 140 is also coupled with the Three-level input Buffer 155, configured to provide a three-level input signal to a second core circuitry terminal (Core2) 165b and a third core circuitry terminal (Core3) 165c. The Three-level input Buffer 155 is programmable via a Three-level input Buffer control input 180j (e.g., one of the I/O Control Signal lines 180). The core circuitry terminals 165 are coupled, for example through the core, with various circuit inputs in a system (not shown) incorporating the programmable I/O buffer 100.

Figure 1B:
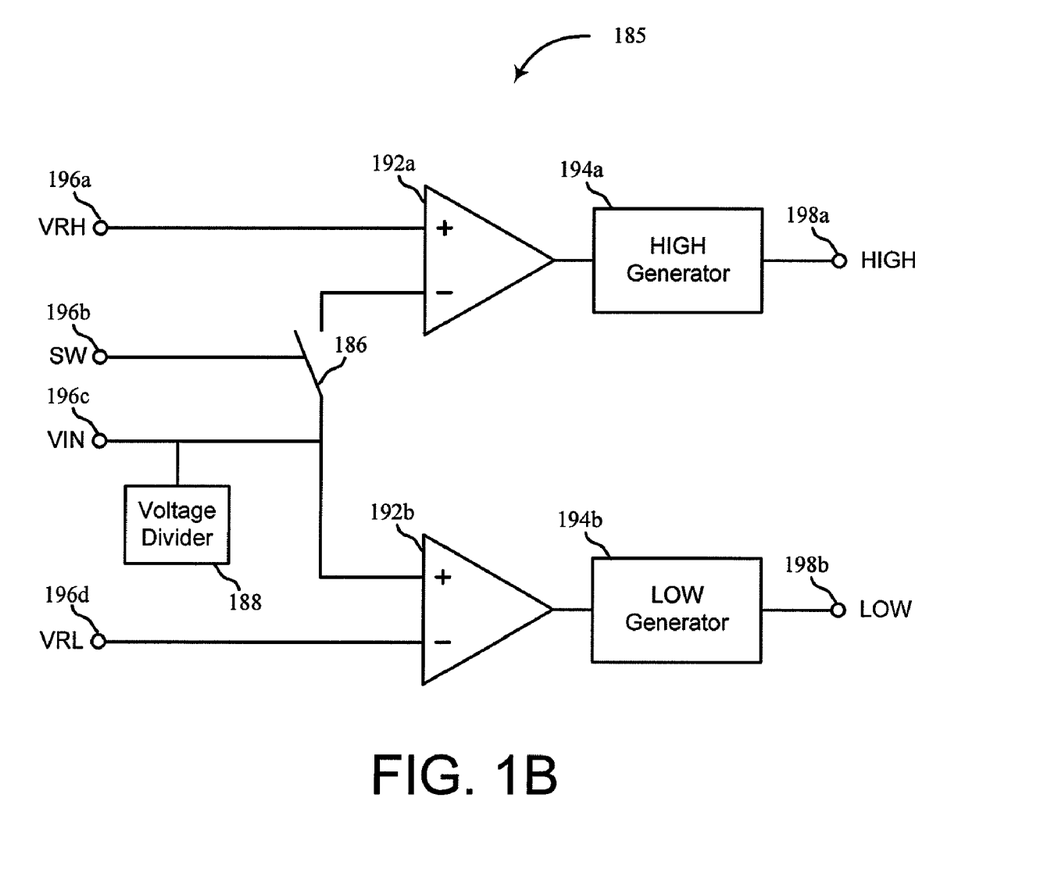
FIG. 1B shows one embodiment of input control components implemented as a combined input buffer having a three-level or low-threshold input buffer and a CMOS-type input buffer.

FIG. 1B shows one embodiment of the input control components 185 implemented as a combined input buffer having a three-level or low-threshold input buffer and a CMOS-type input buffer. The input control components 180 include two comparators 192, and two output signal generators 198. The input control components 180 receive an input signal at pin VIN 196c (e.g., an intermediate voltage level ranging from 0V to VDD). The intermediate voltage level is compared with a high reference voltage received at pin VRH 196a by a first comparator 192a and with a low reference voltage received at pin VRL 196d by a second comparator 192b. Each of the intermediate voltage level, high reference voltage, and low reference voltage may be programmed. In some embodiments, the intermediate voltage level is set (or further set) by a voltage divider 188 (e.g., a programmable resistor divider).

An output of the first comparator 192a is used by a first output generator 194a (e.g., including buffers, amplifiers, etc.) to generate a high output signal at a high pin 198a. An output of the second comparator 192b is used by a second output generator 194b (e.g., including buffers, amplifiers, etc.) to generate a low output signal at the low pin 198b. For example, when VIN falls below VRL, the low output signal may go HIGH (e.g., '1'); and when VIN rises above VRH, the high output signal may go HIGH (e.g., '1'). This may, thus, provide three levels of output by interpreting the low output signal and the high output signal as a two-bit output. If VIN<VRL<VRH, then LOW=logic "1" and HIGH=logic "0". If VRL<VIN<VRH, then LOW=logic "0", HIGH=logic "0". If VRL<VRH<VIN, then LOW=logic "0" and HIGH=logic "1". This may increase the number of logic controls that can be decoded from this type of buffer.

In some embodiments, a switch 186 is provided, which may be controllable by a switch control signal at a SW pin 196b. When the switch 186 is open, the first comparator 192a is effectively disabled, thereby implementing the functionality of a low-threshold, two-level input buffer (e.g., element 150 of FIG. 1A). This type of buffer may be used when the input signal's swing is small, which may make a low-threshold voltage desirable, usually less than an NMOS threshold voltage to switch between logic "0" and "1". It will be appreciated that other components may be included to support various functionality. For example, certain embodiments provide an input buffer with hysteresis to support the input buffer functions.

Returning to FIG. 1A, the I/O Control Signal lines 180 are output by the I/O Control Logic block 170 to affect the operation of various components of the programmable I/O buffer 100. The I/O Control Logic block 170 generates the I/O Control Signal lines 180 from various signals, including, in some embodiments, a set of I/O configuration bits. Table 1 shows a tabulation of I/O configuration bits in descending order with a corresponding functional description provided according to exemplary embodiments.

TABLE 1

Description of programming signals for I/O configuration

| CFIG BIT | Function |
| --- | --- |
| CFIG <15> CFIG <14> | Input enable/line select; CFIG <15:14> = 00: input mode off, 01: drive line1, 10: drive line 2, 11: drive line 3. |
| CFIG <13> | Select 3-level/2-level input (1: 3-level, 0: 2-level input comparator). If CFIG <12> = 0, input inversion enable (1 = invert, 0 = non-invert); if CFIG <6:1> = 0, else output inversion enable (1: inversion, 0: no inversion) |
| CFIG <12> | Select comparator/buffer (1: comparator, 0: buffer) |
| CFIG <11> | Local stop (1: stop output locally) |
| CFIG <10> | Global stop enable (1: enable stop when global stop = 1) if CFIG <6:1> ! = 0, else internal resistor divider enable (1: enable, 0: disable) |
| CFIG <9> | Internal pull-up/down enable (1: pull-up, 0: pull-down) if CFIG <6:1> = 0, else output skew control (1: skew by 4X~80 ps, 0: disable) |
| CFIG <8> | Strong pull-up/down enable (1: enable, 0: disable) if CFIG <6:1> = 0, else output skew control (1: skew by 2X~40 ps, 0: disable) |
| CFIG <7> | Weak pull-up/down enable (1: enable, 0: disable) if CFIG <6:1> = 0, else output skew control (1: skew by 1X~20 ps, 0: disable) |

TABLE 1-continued

Description of programming signals for I/O configuration

| CFIG BIT | Function |
|---|---|
| CFIG <6> | CFIG <6:4>: Output pull-down drive-strengths; 000 = output pull-down off, |
| CFIG <5> | 001 = 1X-strength, 010 = 2X, 100 = 4X, 111 = 7X |
| CFIG <4> | |
| CFIG <3> | CFIG <3:1>: Output pull-up drive-strengths; 000 = output pull-up off, |
| CFIG <2> | 001 = 1X-strength, 010 = 2X, 100 = 4X, 111 = 7X |
| CFIG <1> | |
| CFIG <0> | Input select (1: CLKA, 0: CLKB) |

With particular expansion, configuration bits 3-down-to-1 (CFIG <3:1>) are the configuration bits for activating output pull-up drive strengths. By the presence of the digit one in the corresponding bit position, the output drivers 4X-Driver buffer 135c, the 2X-Driver buffer 135b, and the 1X-Driver buffer 135a, are activated. For example, a "3X" pull-up drive level may be selected by producing CFIG <3:1>=011. A corresponding configuration bits 6-down-to-4 (CFIG <6:4>) configure an activation of output pull-down drive strengths. Output pull-up drive strength and output pull-down drive strength may be configured independently. For instance, a "2X" pull-up drive strength, for example CFIG <3:1>=010, may be selected and a "4X" pull-down drive strength, for example CFIG <6:4>=100, may be selected concurrently.

Other capabilities that are programmable with use of the configuration bits are input drive line selection, three or two level input signaling, input or output inversion, comparator or buffer selection, local or global signaling stop capability, selection of internal resistor divider networks, internal pull-up or pull-down, output skew control, pull-up and pull-down strength, and input clocking selection. The configuration bits, as cited above in Table 1, are available as programming signals for use by a programmable I/O buffer (e.g., as at least a portion of the plurality of Programming Signals 175a coupled with the programmable I/O buffer 100 of FIG. 1A). For example, as in FIG. 1A, after receipt of the configuration bits, the I/O Control Logic block 170 determines which signals are to be produced, and at what logic level, in order to provide the configuring signals on the I/O Control Signal lines 180a-k. Configuration bits may be available in storage, either on- or off-chip, and maintained in nonvolatile memory elements in order to maintain persistence of the configuration values across operational sessions of the programmable buffer. System level memory configurations are described in further details below.

Figure 2:
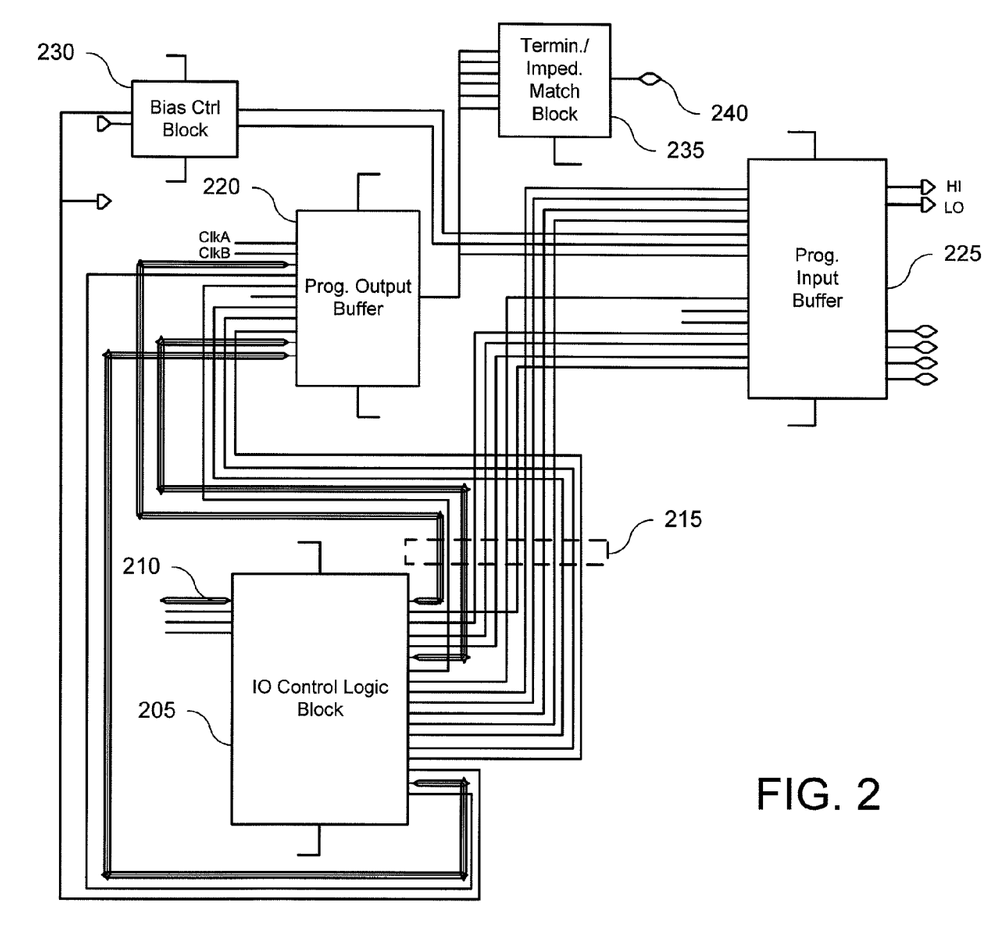
FIG. 2 shows a block diagram showing a programmable I/O buffer according to another embodiment of the present invention.
Figure 3:
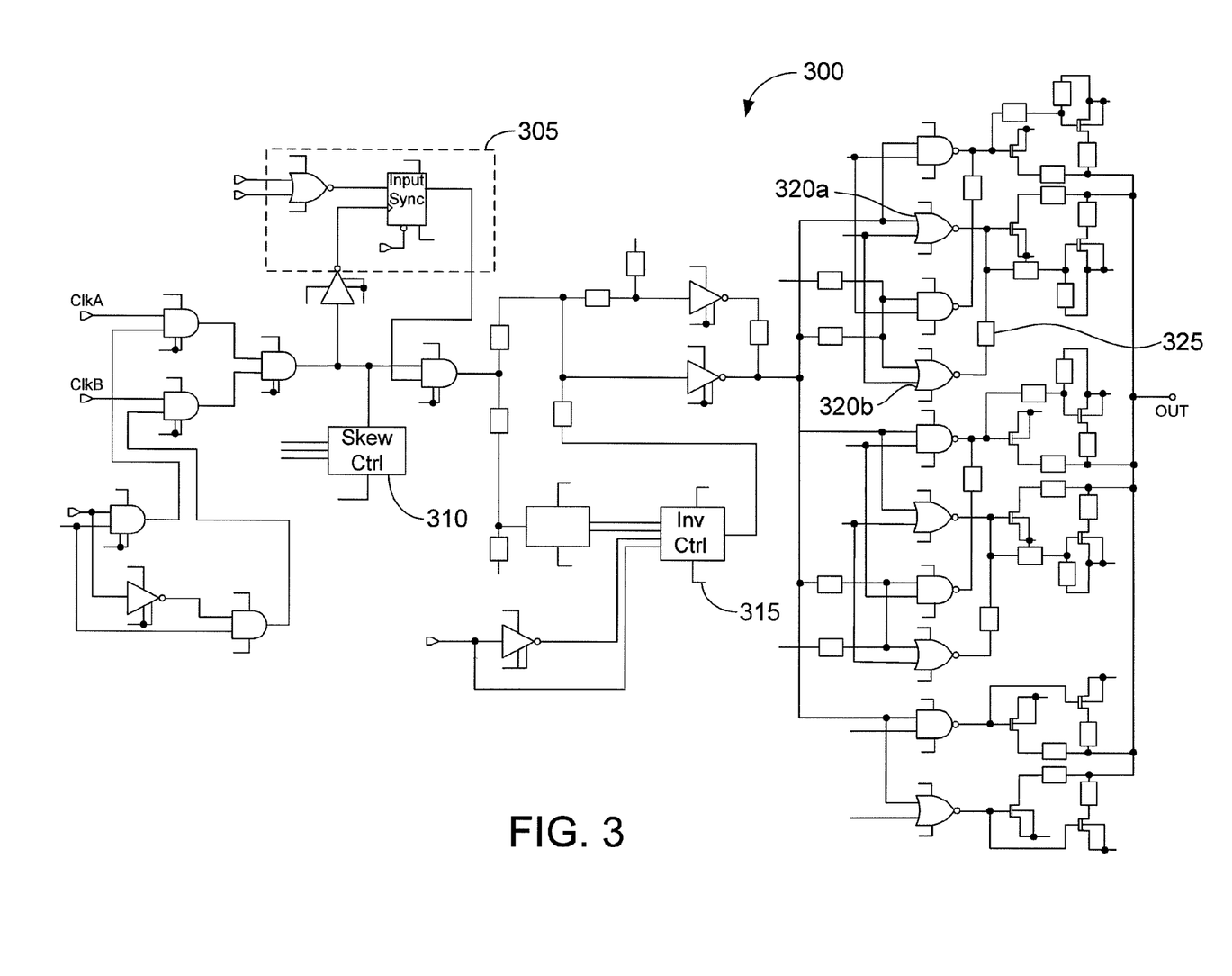
FIG. 3 shows a logic diagram showing a programmable output buffer according to an embodiment of the present invention.

FIGS. 2 and 3 show various illustrative schematic diagrams of embodiments of the circuit blocks described herein with reference to embodiments of the invention. FIG. 2 shows a block diagram of a further exemplary embodiment of the programmable I/O buffer 100, as shown in FIG. 1A. In particular, the device is configured either as an input or an output. The configuration is determined by various selections of signal levels according to configuration bits, which are explained in further detail below. An I/O Control Logic block 205 receives configuration bits (explained below) on a Programming Signals bus 210. In some embodiments, the I/O Control Logic block 205 is implemented as the I/O Control Logic block 170 of FIG. 1A.

A number of I/O Control Signals is coupled on I/O Control Signal lines 215 from the I/O Control Logic block 205 to a Programmable Output Buffer 220 and a Programmable Input Buffer 225. In some embodiments, the Programmable Output Buffer 220 implements some or all of the functionality of the mux 110, the Synchronized Stop Control block 115, the Skew Control block 120, the NAND gate 125, and/or the Inversion Control block 130 of FIG. 1A. In some embodiments, the Programmable Input Buffer 225 implements some or all of the functionality of the Input Buffer 150, the Three-level input Buffer 155, and the Inversion Control block 160 of FIG. 1A.

A Bias Control block 230 couples to the I/O Control Logic block 205 and the Programmable Input Buffer 225. Output terminals of the Bias Control block 230 provide signal connections to the Programmable Input Buffer 225 to control input bias levels at high and low levels. In some embodiments, the Bias Control block 230 provides some or all of the functionality of the Input Pull-up/down Control block 145 of FIG. 1A.

A Termination and Impedance Matching block 235 couples to the Programmable Output Buffer 220 and an Output pad 240. The Termination and Impedance Matching block 235 provides termination resistors for programmable selection of resistance values for impedance matching output drive characteristics at the Output pad 240 to a corresponding load (not shown). In some embodiments, the Termination and Impedance Matching block 235 implements some or all of the functionality of the Driver buffers 135 of FIG. 1A. In certain embodiments, the Termination and Impedance Matching block 235 includes a programmable resistor network. For example, in one embodiment, six configurable resisters are coupled in parallel to a common output PAD. The resistor network is programmable, such that, using programming signals, the number of resistors that are connected in parallel can be changed or some of them can be changed to connect in series. As such, the value of the effective output resistance can be programmed to a certain desired value.

With reference to FIG. 3, an exemplary logic diagram of an embodiment of the present invention is shown. In particular, the device is configured as an Output Buffer 300. The configuration is determined by various selections of signal levels according to configuration bits, which are explained in further detail below. An Input Synchronization block 305 accepts input signals for synchronization in conjunction with use of a latch element. The Input Synchronization block 305 may be used in conjunction with other system elements capable of communication over, for example the inter-integrated circuit (I2C) bus. A Skew Control block 310 provides a programmable delay to control skew for output signaling from the Output Buffer 300.

Across multiple instances of the Output Buffer 300, buffer-to-buffer skew is independently controllable by use of the configuration bits. An Inversion Control block 315 is configurable by use of configuration bits to invert an assertive sense of output signaling. For instance, if signaling received by the Output Buffer 300 is "active-high" in a positive assertion sense, yet a target environment (not shown) in communication with the Output Buffer 300 is "active-low" in positive assertion, the Inversion Control block 315 may be activated with appropriate configuration bits to produce active-low signaling.

Slew rate of the Output Buffer 300 is also under programmable configuration control. Slew Rate Control blocks 320a, b are controlled with configuration bits to adjust circuitry capable of controlling output drive conductivity. Further output drive configuration capabilities are available by mask programmable features. A Mask Programmable block 325 denotes output drive configuration connections selectable by mask programmable features. The Mask Programmable block 325 is either a "SW_ON" or "SW_OFF" block that indicates the block connects or disconnects the signal that goes through it. In the layout, the block "SW_ON" is represented by a VIA placed at a cross of one M1 metal line and one M2 metal line through which the signal flows and for "SW_OFF" block, there is no VIA at that cross to connect those two metal lines. In that way, by changing only a VIA mask, different connections for a circuit can be achieved without increasing complexity of its logic control. In the "SW_ON" schematic, the input and output pins of the block A and B are connected. In the block "SW_OFF", A and B are disconnected.

Figure 4:
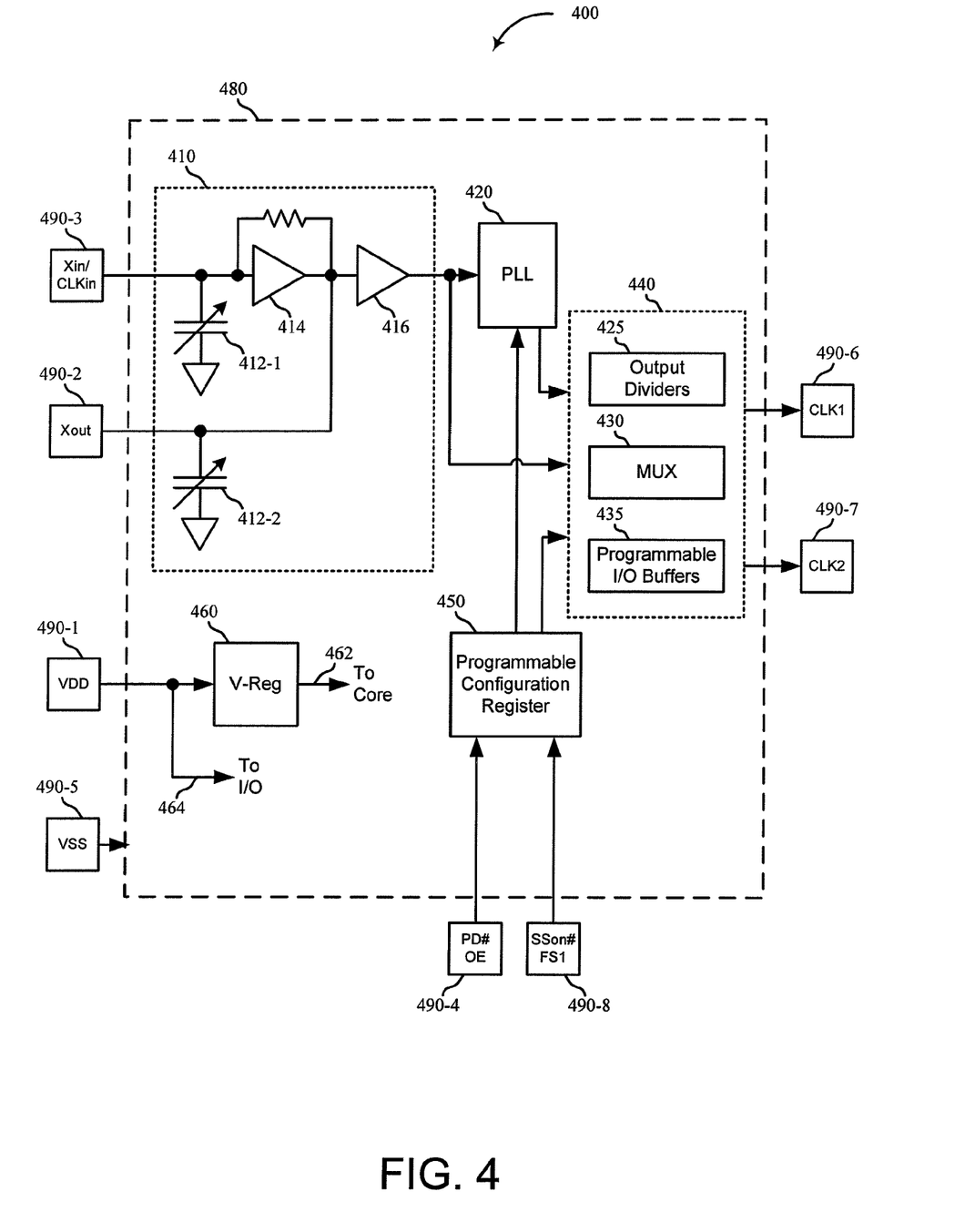
FIG. 4 shows a simplified block diagram of a circuit arrangement using programmable I/O buffers, according to an embodiment of the invention.

It will be appreciated that programmable I/O buffer functionality (e.g., as illustrated in FIGS. 1-3) may be integrated as a component of a circuit arrangement. FIG. 4 shows a simplified block diagram of a circuit arrangement 400 using programmable I/O buffers, according to various embodiments of the invention. The circuit arrangement 400 is shown as an integrated circuit component 480 with a number of pins 490. Each of the pins provides certain input/output functionality, and may be optimized according to its function. For example, the $V_{DD}$ pin 490-1 and the $V_{SS}$ pin 490-5 may be metalized as power pins.

The circuit arrangement 400 includes a reference control block 410, a phase-lock loop (PLL) block 420, an I/O control block 440, a programmable configuration register block 450, and a power conditioning block 460. In some embodiments, a crystal oscillator or other clock source is coupled with the $X_{IN}$ pin 490-3 and the $X_{OUT}$ pin 490-2. In one embodiment, variable capacitance elements 412 are used to tune the external clock source (e.g., when a crystal or ceramic oscillator is used). A gain stage 414, buffer 416, and/or other components of the reference control block 410 may be used to further control the output of the reference clock control block 410 to generate a master clock signal for use by other blocks of the circuit arrangement 400. In some embodiments, the output of the reference control block 410 is used as a master clock signal for the PLL block 420. The PLL block 420 is programmable to provide a reference clock signal as a function of the frequency and/or phase of the output of the reference control block 410. For example, the PLL block 420 uses negative feedback to maintain a stable reference clock signal that is mathematically related to the master clock signal.

Embodiments of the programmable configuration register block 450 provide configuration signals for use by various components of the circuit arrangement 400. The programmable configuration register block 450 may include a number of programmable registers distributed throughout the integrated circuit. For example, the registers may provide distributed, small-scale, volatile memory that are set by a centralized non-volatile memory on power-up. In one embodiment, the programmable configuration register block 450 is affected in part by input pins, including a PD#/OE pin 490-4 and an SSon#/FS1 pin 490-8. For example, the PD#/OE pin 490-4 provides either a Power Down signal (e.g., if PD#=0 (Low), the device is powered down and both SSCLK and REFOUT outputs are weakly pulled low to VSS) or an Output Enable signal (e.g., if OE=1(High)), the SSCLK and REFOUT outputs are enabled; and the SSon#/FS1 pin 490-8 provides either a Programmable Spread Spectrum ON signal (e.g., if SSon#=0 (Low), spread spectrum clocking is on, and if SSon#=1 (High), spread spectrum clocking is off) or a Frequency Select signal (e.g., if FS function is programmed, the clock frequencies can be switched between two sets of frequencies, as programmed).

In some embodiments of the circuit arrangement 400, outputs from the reference control block 410, the PLL block 420, and the programmable configuration register block 450 are passed to the I/O control block 440. Embodiments of the I/O control block 440 include an output divider block 425, a multiplexer (mux) block 430, and a programmable I/O buffer block 435. The component blocks of the I/O control block 440 are used to control the characteristics and operation of I/O terminals, like the CLK1 pin 490-6 and the CLK2 pin 490-7. For example, the programmable I/O buffer block 435 may be implemented according to embodiments shown in FIGS. 1-3.

It will be appreciated that other functionality may be provided by embodiments of the circuit arrangement 400. In some embodiments, the power conditioning block 460 is included to provide certain power management and/or conditioning functionality. In the embodiment shown, the $V_{DD}$ pin 490-1 ins coupled with the power conditioning block 460. The power conditioning block 460 then generates an I/O power signal 464 and a core power signal 462, providing appropriate power for driving various I/O and core components, respectively. For example, the integrated circuit 480 may be coupled, via the $V_{DD}$ pin 490-1, with a 3.8-volt supply. The power conditioning block 460 may be used to convert the 3.8-volt source voltage to a 1.8-volt signal, which may be desired for use by various components of the circuit arrangement 400.

Figure 5:
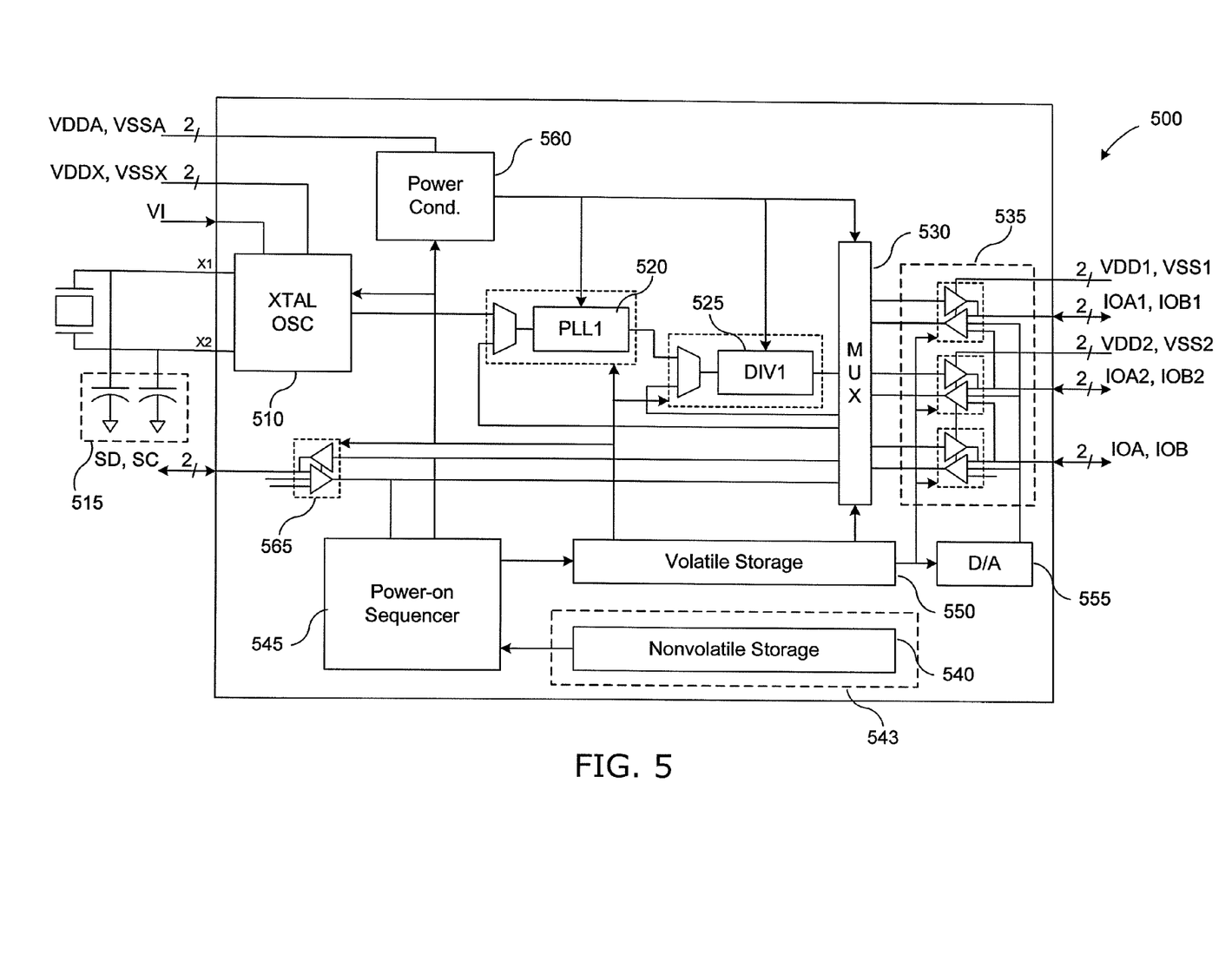
FIG. 5 shows a block diagram of a system incorporating an embodiment of the present invention.

FIG. 5 illustrates another simplified block diagram of a circuit arrangement 500 using programmable I/O buffers, according to various embodiments of the invention. An external crystal couples to a voltage controlled crystal oscillator (VCXO) 510 in an exemplary embodiment. A pair of capacitors 515 couple crystal oscillator inputs X1, X2 to ground. VCXO power (VDDX), VCXO ground (VSSX), and VCXO input voltage (VI) are external inputs to the VCXO 510. In some embodiments, the VCXO 510 is implemented as the reference control block 410 of FIG. 4.

An output of the VCXO 510 is connected with an input multiplexer (mux) of a phase lock loop (PLL1) 520, providing a reference signal for the PLL 520. Embodiments of the first phase lock loop 520 are implemented as block 420 of FIG. 4. In other embodiments, additional PLLs 520 may be used to allow for additional I/Os and further programmability. An output of the phase lock loop 520 is connected with an input multiplexer (mux) of a PLL divider (DIV1) 525. An output of the PLL divider 525 is fed to a MUX 530. A first set of outputs of the MUX 530 are connected with programmable input/output buffers 335. Additional outputs from the MUX 530 may be connected with the input mux of PLL1 520 and the input mux of the PLL divider 525. Embodiments of the PLL divider 525, the MUX 530, and the programmable input/output buffers 535 are implemented as the output divider block 425, mux block 430, and programmable I/O buffer block 435, respectively, of the I/O control block 440 of FIG. 4.

It will be appreciated that embodiments of each instance of the programmable input/output buffers 535 (shown as a dashed box) implement two programmable I/O buffers, like the programmable I/O buffer 100 of FIG. 1A. As shown, a first set of bi-directional (input/output) connections IOA1, IOB1 is powered by a first set of output buffer power supply terminals VDD1,VSS1; a second set of bi-directional (input/output) connections IOA2, IOB2 is powered by a second set of output buffer power supply terminals VDD2,VSS2; and a third set of bi-directional (input/output) connections IOA, IOB is powered by the second set of output buffer power supply terminals VDD2,VSS2. Terminals IOA, IOB, IOA1, IOB1, IOA2, and IOB2 provide interfaces to six programmable I/O buffers. In other embodiments, there may be more, or fewer programmable I/O buffers.

The clock generator circuit 500, including a nonvolatile storage array 540, may be fabricated, for example, in a single monolithic semiconductor substrate or alternately, the nonvolatile storage array 540 may reside on a second semiconductor substrate 543. An output of the nonvolatile storage array 540 may be in communication with a power-on sequencer 545. The power-on sequencer 545 may communicate with a volatile storage array 550. In some embodiments, portions of the nonvolatile storage array 540, the power-on sequencer 545, and/or the volatile storage array 550 are implemented as the programmable configuration register block 450 of FIG. 4.

The volatile storage array 550 is in communication with a digital-to-analog (D/A) block 555, a power conditioner block 560, a serial I/O block 565, the programmable input/output buffers 535, the mux 530, the PLL 520, the PLL divider 525, and the VCXO 510. The serial I/O block 565 communicates with serial data and serial clock inputs SD,SC, the power-on sequencer 545, and the MUX 530. The power conditioner block 560 is connected with PLL power inputs VDDA,VSSA. In some embodiments, the Power Conditioner block 560 is implemented as the power conditioning block 460 of FIG. 4.

In some embodiments, output drivers 1X-, 2X-, and 4X-Driver 135a-c of FIG. 1A, correspond to one instance of an output portion of the programmable input/output buffers 535 of FIG. 5. Similarly, the input portion of each of the programmable input/output buffers 535 corresponds to an instance of the Input Buffer 150 of FIG. 1A. The serial I/O block 565 may also be fabricated, for example, with instances of the programmable I/O buffer 100 of FIG. 1A, configured appropriately to requirements established by serial protocols, such as, for example, the inter-integrated circuit (I2C) bus. Sets of configuration data (e.g., as shown in Table 1) may be maintained in the nonvolatile storage array 540 and made available to configure the programmable input/output buffers 535 at system power up through the power-on sequencer 545 (e.g., operating synonymously to the I/O Control Logic block 170 of FIG. 1A).

Figure 6:
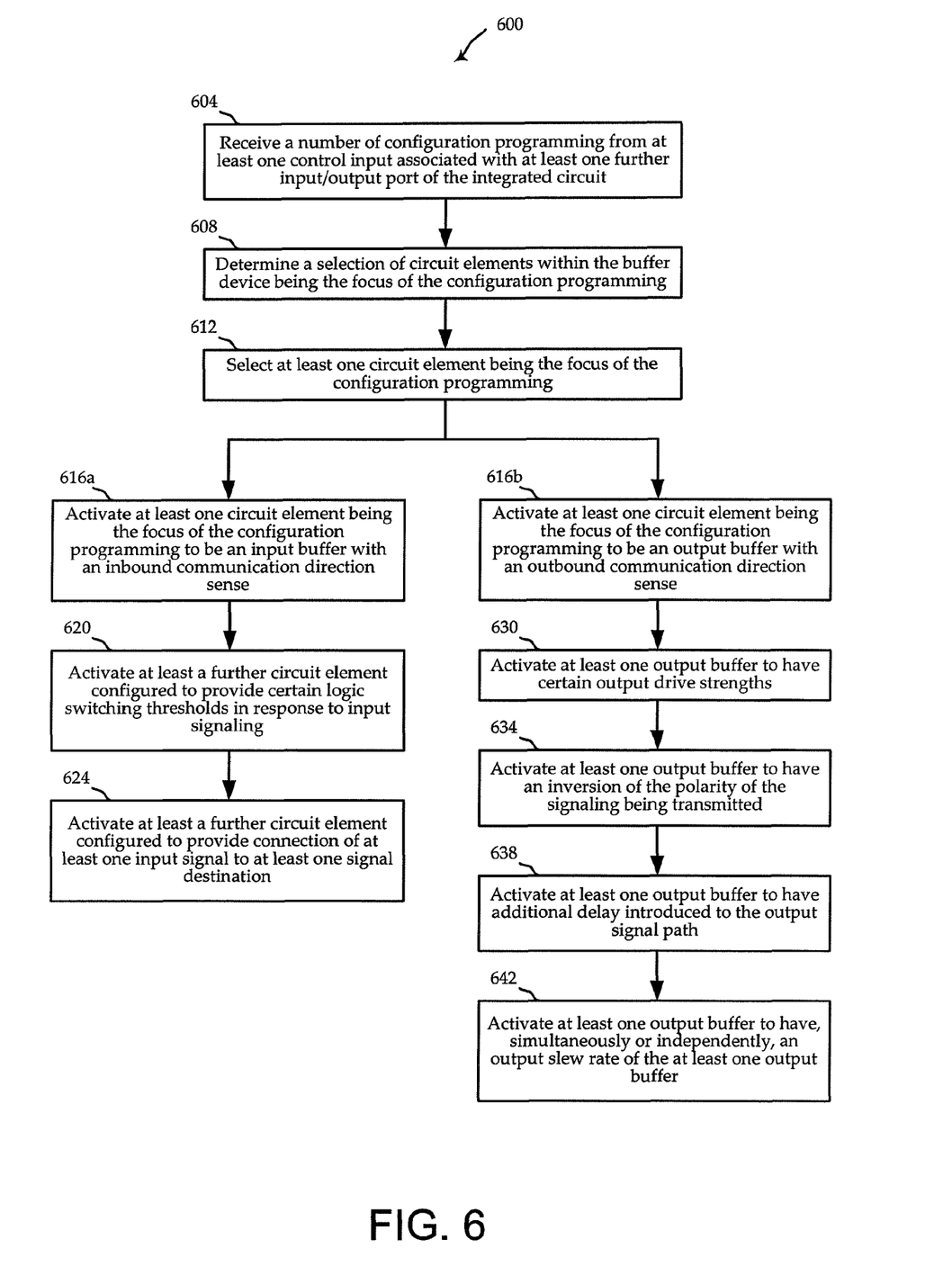
FIG. 6 shows a flow diagram of an embodiment of a method for configuring a buffer device coupled to at least one input/output port of an integrated circuit, according to an embodiment of the invention.

FIG. 6 shows a flow diagram of an embodiment of a method 600 for configuring a buffer device coupled to at least one input/output port of an integrated circuit, according to various embodiments. The method 600 begins at block 604 by receiving a number of configuration programming from at least one control input associated with at least one further input/output port of the integrated circuit. At block 608, a selection of circuit elements is determined within the buffer device being the focus of the configuration programming. The method 600 then selects at least one circuit element being the focus of the configuration programming at block 612. At least one circuit element may then be activated to be an input and/or output buffer with an input, output, or bi-directional communication direction sense. Activation of the at least one circuit element as an input buffer is shown as the left-hand flow path beginning with block 616a, and activation of the at least one circuit element as an output buffer is shown as the right-hand flow path beginning with block 616b.

For example, at block 616a, the at least one circuit element is activated being the focus of the configuration programming to be an input buffer with an inbound communication direction sense. The method 600 may activate at least a further circuit element configured to provide certain logic switching thresholds in response to input signaling at block 620. At least a further circuit element, configured to provide connection of at least one input signal to at least one signal destination, may then be activated at block 624.

In other embodiments, at block 616b, the at least one circuit element is activated being the focus of the configuration programming to be an output buffer with an outbound communication direction sense. The method 600 may activate at least one output buffer to have certain output drive strengths at block 630. At least one output buffer may also be activated at block 634 to have an inversion of the polarity of the signaling being transmitted. At block 638, at least one output buffer may be activated to have additional delay introduced to the output signal path; and at block 642, at least one output buffer may be activated to have, simultaneously or independently, an output slew rate of the at least one output buffer.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

It should also be appreciated that the following systems and methods may individually or collectively be components of a larger system, wherein other procedures may take precedence over or otherwise modify their application. Also, a number of steps may be required before, after, or concurrently with the following embodiments. Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Accordingly, the above description should not be taken as limiting the scope of the invention, which is defined by the appended claims.

What is claimed is:
1. A buffer device coupled to at least one input/output port of an integrated circuit, the buffer device comprising:
   a plurality of control inputs capable of receiving configuration programming; and
   at least one input/output circuit capable of being configured in a directional sense of communication by the configuration programming received at the plurality of control inputs, the at least one input/output circuit capable of being:

configured as at least one input circuit capable of being further configured to provide input logic switching level thresholds according to the configuration programming, and configured as at least one output circuit capable of being further configured to provide a slew rate that is configurable independently of an output drive strength and an output drive strength that is configurable independently of the slew rate according to the configuration programming.

2. The buffer device of claim 1, wherein the configuration programming is a sequence of signaling containing electrical levels capable of being determined by the buffer device and producing particular circuit element selection effecting a particular operational configuration.

3. The buffer device of claim 1, wherein the at least one input/output circuit is configured by the configuration programming to be an input buffer.

4. The buffer device of claim 3, wherein the configuration programming configures the at least one input/output circuit to logically switch, in response to input signaling, at certain logic switching thresholds.

5. The buffer device of claim 3, wherein the configuration programming configures the at least one input/output circuit to selectively connect an input signal to one or more signal destinations.

6. The buffer device of claim 5, wherein the one or more signal destinations being common buses in electrical communication with a plurality of buffers.

7. The buffer device of claim 1, wherein the at least one input/output circuit is configured by the configuration programming to be an output buffer.

8. The buffer device of claim 7, wherein the configuration programming configures the at least one output circuit to have certain output drive strengths.

9. The buffer device of claim 7, wherein the configuration programming configures the at least one input/output circuit to have an inversion in polarity of signaling being transmitted.

10. The buffer device of claim 7, wherein the configuration programming configures a pull-up drive strength or a pull-down drive strength of the at least one output circuit independently.

11. The buffer device of claim 7, wherein the configuration programming configures the at least one output circuit to have additional delay introduced to the output signal path, the magnitude of delay introduced being further configured by the configuration programming.

12. The buffer device of claim 7, wherein the output circuit includes at least one slew rate control component that controls an output slew rate of the at least one output circuit, responsive to the configuration programming, by controlling a signal that drives at least one output transistor so as to enable the slew rate to be changed without substantially affecting the output drive strength.

13. An integrated circuit buffer comprising:

a plurality of control inputs used to receive configuration programming, the configuration programming capable of electrically configuring the buffer as either one or two inputs or a differential output buffer, said input buffers having a plurality of input switching thresholds, and an inversion block coupled to a single ended output, the inversion block, responsive to the configuration programming, configures the buffer as a differential output buffer by inverting a signal output from the single-ended-output so as to create a complimentary-signal relative to another true-signal that is output from another single-ended-output so as to create a differential output between the two single-ended-outputs, said output buffer having a plurality of output drive strengths each controlled by one or more of said control inputs, wherein a slew rate of a rising output signal or a falling output signal from the integrated circuit buffer, configured as a differential output buffer, is further configured, independently of drive strength, by the configuration programming.

14. The integrated circuit buffer of claim 13, wherein the integrated circuit buffer configured as either one or two input buffers is capable of having the buffered input signal selectively coupled to one or more input destinations, the one or more input destinations configured by the configuration programming.

15. The integrated circuit buffer of claim 14, wherein the one or more input destinations are common buses in electrical communication with a plurality of buffers.

16. The integrated circuit buffer of claim 13, wherein the configuration programming independently configures a pull-up drive strength and a pull-down drive strength of the at least one output circuit independently.

17. The integrated circuit buffer of claim 13, wherein additional delay being independently added to the true-signal output path or the complimentary-signal output path of the integrated circuit buffer configured as a differential output buffer, a magnitude of delay being configured according to the configuration programming.

18. The integrated circuit buffer of claim 13, wherein the slew rate of the rising output signal or the falling output signal is configured substantially independent of the output impedance.

19. The integrated circuit buffer of claim 13, wherein a signal source is coupled from common buses in electrical communication with at least one of a plurality of buffers to one of a plurality of integrated circuit buffers configured as a differential output buffer.

20. A method of configuring a buffer device coupled to at least one input/output port of an integrated circuit, the method comprising:

receiving a plurality of configuration programming from at least one control input associated with at least one further input/output port of the integrated circuit;

determining a selection of circuit elements within the buffer device being the focus of the configuration programming;

selecting at least one output circuit element being the focus of the configuration programming; and activating the at least one output circuit element being the focus of the configuration programming, the activating including modifying characteristics of the output circuit element capable of being further configured to provide a slew rate that is configurable independently of an output drive strength and an output drive strength that is configurable independently of the slew rate according to the configuration programming.

21. A method of configuring a buffer device coupled to at least one input/output port of an integrated circuit, the method comprising:

receiving configuration programming from at least one control input associated with at least one further input/output port of the integrated circuit that sets the buffer device as an input buffer device;

receiving configuration programming that defines whether the buffer device is a three-level or a two-level input buffer device;

determining a selection of circuit elements within the buffer device being the focus of the configuration programming;

selecting at least one circuit element being the focus of the configuration programming that sets the buffer device as an input buffer device;

activating the at least one circuit element being the focus of the configuration programming to be an input buffer with an inbound communication direction sense; and enabling another circuit element, responsive to the configuration programming defining the buffer device as a two-level or a three-level input buffer device.

22. The method of configuring a buffer device of claim 21, wherein enabling another circuit element includes enabling a second comparator in addition to an already enabled first comparator so as to enable an input signal to the buffer device to be compared, simultaneously, with two reference voltages so as to generate a two-bit output that is decodable into three logic states that identify three voltage levels of the input signal.

23. The method of configuring a buffer device of claim 22 further comprising:

receiving configuration programming that defines a particular intermediate voltage level; and altering a voltage of the input signal that is applied to the two comparators responsive to the programming so as to effectuate the particular intermediate voltage level.

24. A method of configuring a buffer device coupled to at least one input/output port of an integrated circuit, the method comprising:

receiving a plurality of configuration programming from at least one control input associated with at least one further input/output port of the integrated circuit that sets the buffer device as an output buffer device;

receiving configuration programming that defines a slew rate;

determining a selection of circuit elements within the buffer device being the focus of the configuration programming that sets the buffer device as an output buffer device;

selecting at least one circuit element being the focus of the configuration programming that sets the buffer device as an output buffer device;

activating the at least one circuit element being the focus of the configuration programming to be an output buffer with an outbound communication direction sense; and controlling, responsive to the configuration programming that defines a slew rate, a drive signal that drives an output transistor of the buffer device so as to alter a switching rate of the output transistor independently of a drive strength of the output transistor.

25. The method of configuring a buffer device of claim 24 further comprising:

activating at least one output buffer to have certain output drive strengths.

26. The method of configuring a buffer device of claim 24 further comprising:

activating at least one output buffer to have an inversion of the polarity of the signaling being transmitted.

27. The method of configuring a buffer device of claim 24 further comprising:

activating at least one output buffer to have additional delay introduced to the output signal path.

* * * * *